United States Patent
Hu et al.

(10) Patent No.: US 7,896,597 B2
(45) Date of Patent: Mar. 1, 2011

(54) FASTENER

(75) Inventors: Feng Hu, Shenzhen (CN); Gen-Ping Deng, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 246 days.

(21) Appl. No.: 12/238,420

(22) Filed: Sep. 25, 2008

(65) Prior Publication Data
US 2009/0257820 A1  Oct. 15, 2009

(30) Foreign Application Priority Data
Apr. 9, 2008  (CN) .................... 2008 1 0066297

(51) Int. Cl.
*F16B 39/22* (2006.01)
(52) U.S. Cl. ...................... 411/291; 411/168
(58) Field of Classification Search ............. 411/291, 411/263, 264, 168
See application file for complete search history.

(56) References Cited
U.S. PATENT DOCUMENTS

| | | | | |
|---|---|---|---|---|
| 2,035,055 A | * | 3/1936 | Dyer | 411/259 |
| 2,224,659 A | * | 12/1940 | Stoll | 148/226 |
| 2,427,560 A | * | 9/1947 | Johnson | 411/259 |
| 2,542,377 A | * | 2/1951 | Turkish | 411/334 |
| 2,555,662 A | * | 6/1951 | Schneider | 411/168 |
| 2,576,438 A | * | 11/1951 | Beach | 411/168 |
| 2,670,022 A | * | 2/1954 | Oldberg et al. | 411/168 |

\* cited by examiner

*Primary Examiner*—Gary Estremsky
(74) *Attorney, Agent, or Firm*—Frank R. Niranjan

(57) ABSTRACT

A fastener for fastening a heat sink to a printed circuit board via a back plate comprises a head and a shaft extending from the head. The shaft comprises a first and second engaging portions and a connecting portion therebetween. The first and second engaging portions have outer threads on exteriors thereof. Two cutouts are defined in the connecting portion. The back plate defines four thread holes machined with inner threads for engaging with the outer threads. In use of the fastener, an elastic force is produced to the fastener due to a deformation of the two cutouts during the threading. The elastic force helps the outer threads to have a secure engagement with the inner threads whereby the fastener can firmly engage with the back plate even when the fastener is subject to vibration or shock.

5 Claims, 5 Drawing Sheets

FASTENER

BACKGROUND

1. Field of the Invention

The present invention relates to a fastener, and more particularly to a fastener for fastening a heat sink to an electronic device, whereby the heat sink can effectively dissipate heat generated by the electronic device.

2. Description of Related Art

It is well known that, during operation of a computer, electronic devices such as central processing units (CPUs) frequently generate large amounts of heat. The heat must be quickly removed from the electronic device to prevent it from becoming unstable or being damaged. Typically, a heat sink is attached to an outer surface of the electronic device to absorb heat generated by the electronic device. A fastener is needed to keep the heat sink in tight contact with the electronic device.

Referring to FIG. 5, a conventional fastener 10 for a heat sink 20 includes a head 12 and a shaft 14 extending integrally and downwardly from the head 12. The shaft 14 has threads machined onto an exterior thereof. The head 12 defines a cross-shaped groove (not shown) in a top end thereof for facilitating operation of a tool such as a screwdriver thereon. The shafts 14 of the four fasteners 10 extend through the heat sink 20 and then a printed circuit board 30 to threadedly engage with four thread holes 50 of a back plate 40. At this time, the heat sink 20 and an electronic device 60 mounted onto the printed circuit board 30 are fastened together so that the heat sink 20 can have an intimate contact with the electronic device 60. However, during use or transportation of the electronic device 60, the fasteners 10 are subject to vibration or shock whereby the threaded connection between fasteners 10 and the back plate 40 can be loose; when this happens, the heat sink 20 can no longer have an intimate contact with the electronic device 60.

What is needed, therefore, is a fastener for a heat sink which is capable of securely fastening the heat sink to an electronic device even when the electronic device is subject to vibration or other adverse circumstances.

SUMMARY

A fastener for fastening a heat sink to a printed circuit board via a back plate comprises a head and a shaft extending integrally and downwardly from the head. The shaft comprises a first engaging portion, a second engaging portion and a connecting portion interconnecting the first engaging portion and the second engaging portion. The first and second engaging portions have outer threads machined onto exteriors thereof. The connecting portion does not have threads thereon. Two cutouts are defined at two ends of the connecting portion. The back plate defines four thread holes machined with inner threads onto interiors of these thread holes. The outer threads on the first engaging portion have a same pitch with those on the second engaging portion and are not continuous with an extension of those on the second engaging portion. The inner threads are engaged with the outer threads machined onto the exteriors of the first and second engaging portions. In use of the fastener, an axial elastic force is generated to the first and second engaging portions of the fastener by a compressed deformation of the two cutouts. The elastic force helps a secure engagement between the inner threads and the outer threads to prevent the fastener from loosening from the back plate due to vibration or shock.

Other advantages and novel features of the present invention will become more apparent from the following detailed description of an embodiment/embodiments when taken in conjunction with the accompanying drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

DETAILED DESCRIPTION

Figure 1:
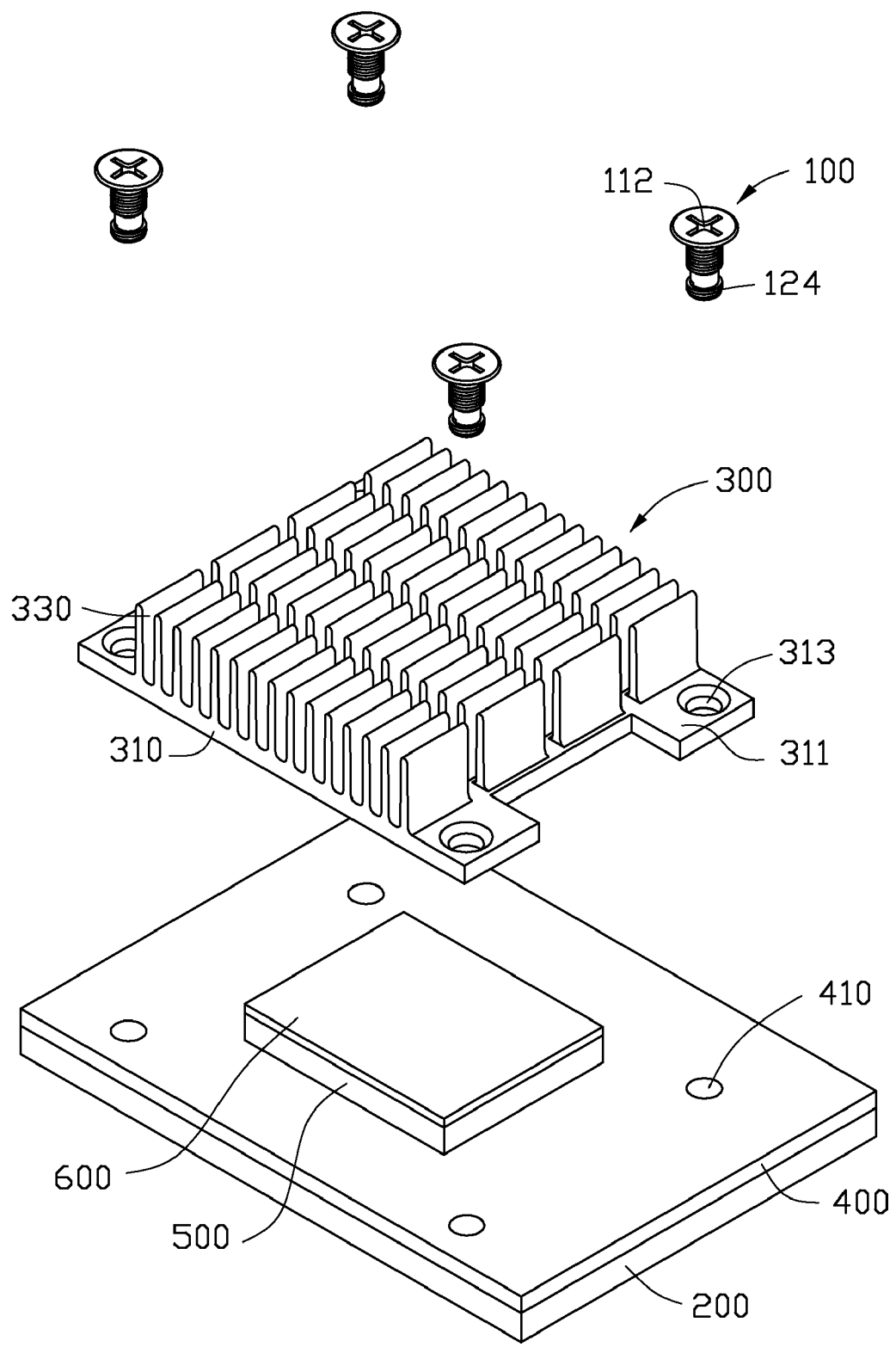
FIG. 1 is an exploded, isometric view of four fasteners in accordance with a preferred embodiment of the present invention and related components.
Figure 2:
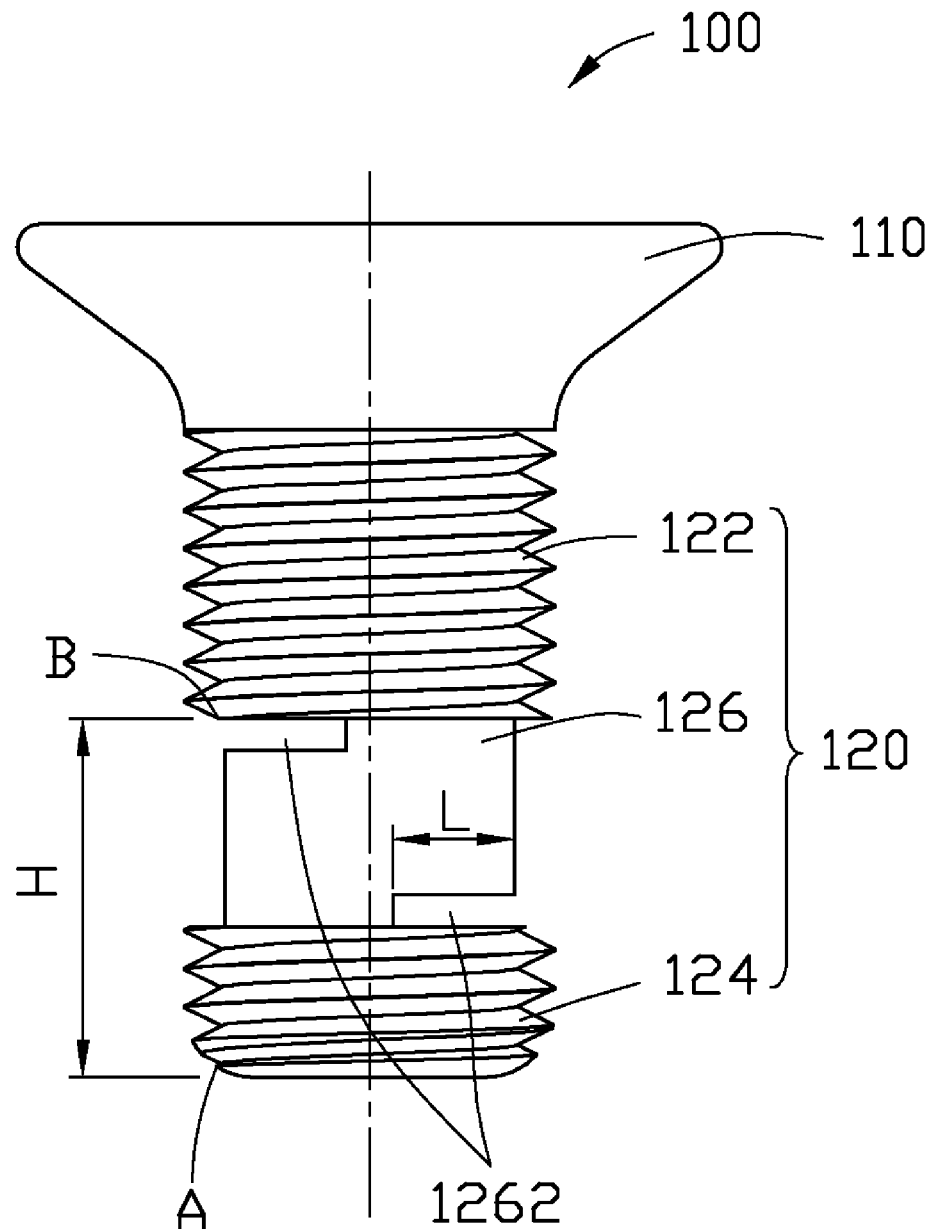
FIG. 2 is a front elevational view of one of the fasteners of FIG. 1.

Referring to FIGS. 1 and 2, four fasteners 100 in accordance with a preferred embodiment of the present invention are used to secure a heat sink 300 on a printed circuit board 400 through assistance of a back plate 200 to dissipate heat generated by an electronic device 500 mounted on the printed circuit board 400.

The fasteners 100 each include a head 110 and a shaft 120 extending integrally and downwardly from the head 110. The shaft 120 comprises a first engaging portion 122, a second engaging portion 124 and a connecting portion 126 interconnecting the first engaging portion 122 and the second engaging portion 124. The head 110 defines a cross-shaped groove 112 at a top end thereof for facilitating operation of a tool such as a screwdriver thereon. The first engaging portion 122 is machined with same outer threads onto an exterior thereof as the second engaging portion 124. The outer threads on the first engaging portion 122 have a pitch the same as that of the outer threads on the second engaging portion 124. The first engaging portion 122 has a same diameter as the second engaging portion 124, but the diameter of the first engaging portion 122 is larger than that of the connecting portion 126. The connecting portion 126 does not have threads formed thereon. Two cutouts 1262 are defined in two ends of the connecting portion 126 and adjacent to the first engaging portion 122 and the second engaging portion 124 respectively. The two cutouts 1262 are located at two opposite sides of the connecting portion 126 respectively. The two cutouts 1262 are parallel to each other. A radial length of each cutout 1262 is a little less than a radius of the connecting portion 126. In other embodiments, the radial length of the cutout 1262 is slightly larger than or equal to the radius of the connecting portion 126. In this embodiment, H stands for a sum of axial lengths of the connecting portion 126 and the second engaging portion 124. H is not an integer multiple of a pitch of the outer threads.

Figure 4:
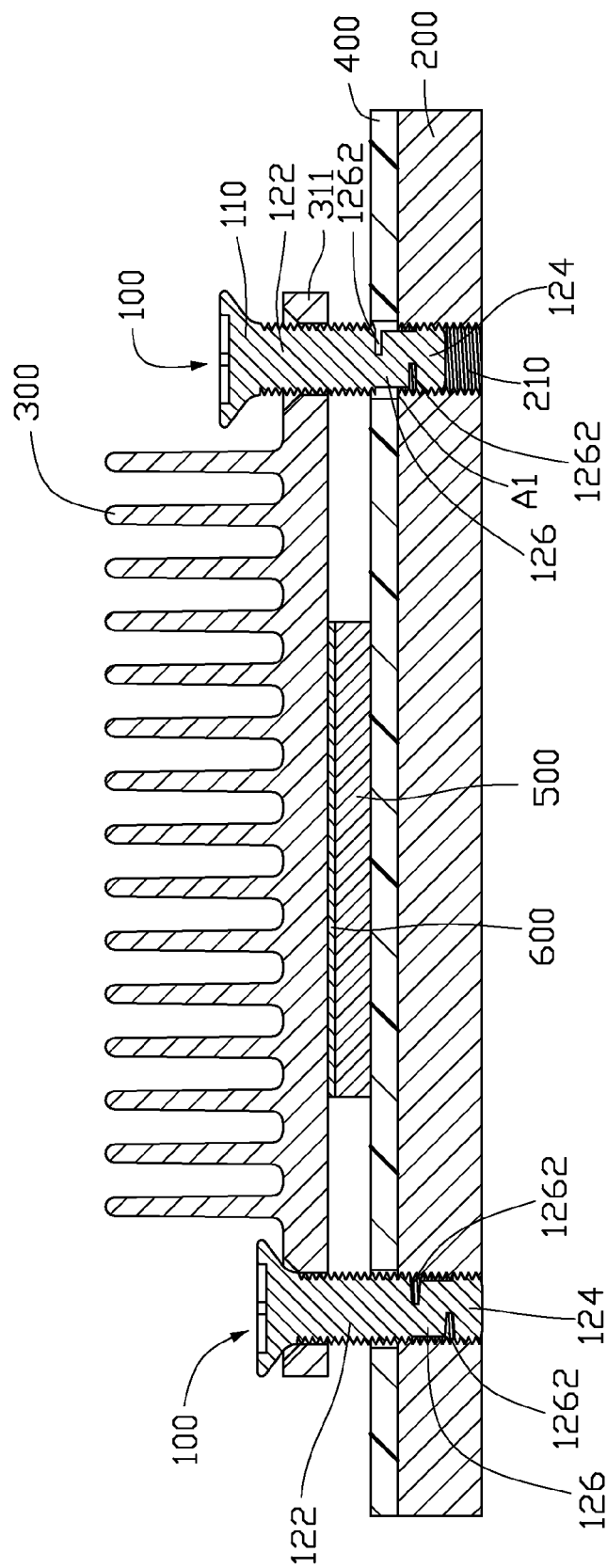
FIG. 4 is a sectional view taken along a line IV-IV of FIG. 3.
Figure 5:
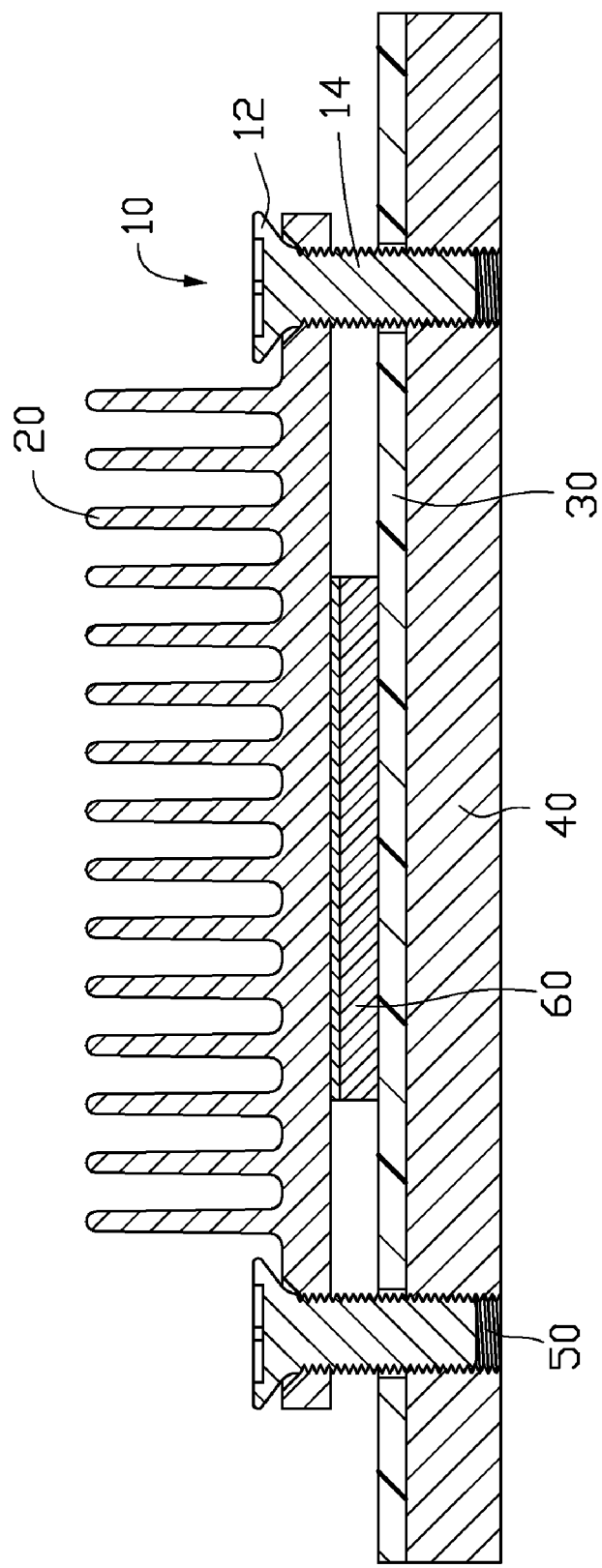
FIG. 5 is a sectional view showing fasteners in accordance with related art fastening related components together.

Referring to FIGS. 1 and 4, the heat sink 300 is integrally formed by aluminum extrusion. The heat sink 300 comprises a base 310 and a plurality of parallel fins 330 extending integrally and upwardly from the base 310. The fins 330 are perpendicular to the base 310. Four mounting portions 311 extend integrally and horizontally from four corners of the base 310 outwardly. Each of the mounting portions 311 defines a through hole 313 for the fastener 100 extending therethrough. Four extending holes 410 in alignment with the through holes 313 are defined through printed circuit board 400 around the electronic device 500. Four thread holes 210 are defined in the back plate 200 and are in alignment with the four extending holes 410 of the printed circuit board 400 and the four through holes 313 of the heat sink 300. Each of the thread holes 210 is machined with inner threads onto an interior thereof. These inner threads are coupled with those outer threads machined onto the exteriors of the first and second engaging portions 122, 124.

Figure 3:
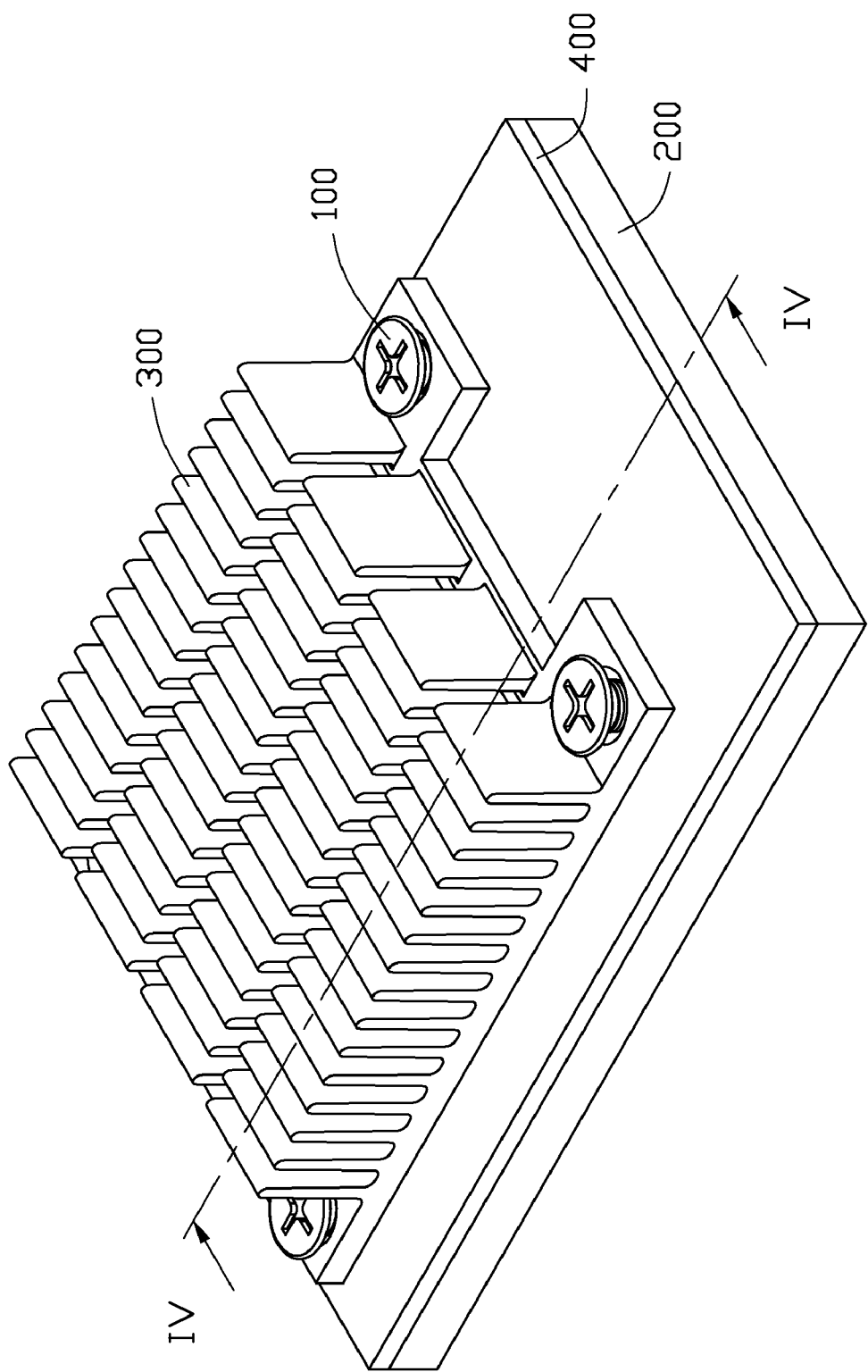
FIG. 3 is an assembled view of FIG. 1.

Referring to FIG. 3 and FIG. 4, in use of the fasteners 100, the four fasteners 100 are threadedly engaged with the four thread holes 210 of the back plate 200 via the shafts 120 of the fasteners 100 respectively extending sequentially through the four through holes 313 of the heat sink 300 and the four extending holes 410 of the printed circuit board 400. The heat sink 300 and the electronic device 500 mounted on the printed circuit board 400 are fastened together by the fasteners 100 so that the base 310 of the heat sink 300 has an intimate contact with the electronic device 500 via a thermal interface material 600 spread on a top surface of the electronic device 500.

A detailed introduction of each fastener 100 threaded to the back plate 200 is given below. Point A in FIG. 2 stands for a mesh point of the outer threads at a bottom end of the second engaging portion 124. Point A1 in FIG. 4 stands for a mesh point of the inner threads at a top end the threaded hole 210 defined in the back plate 200. Point B in FIG. 2 stands for a mesh point of the outer threads at a bottom end of the first engaging portion 122.

In a process of the fastener 100 threaded to the back plate 200 by a tool such as a screwdriver, when the mesh point A coincides with the mesh point A1, the outer threads of the second engaging portion 124 begin to engage with the inner threads of the threaded hole 210 defined in the back plate 200. Before the outer threads of the first engaging portion 122 begin to engage with the inner threads of the threaded hole 210, the two cutouts 1262 of the connecting portion 126 are intact. When the mesh point B coincides with the mesh point A1, the outer threads of the first engaging portion 122 begin to engage with the inner threads of the threaded hole 210. Since H is not an integral multiple of the pitch of the outer threads, the outer threads on the first engaging portion 122 are not continuous with an extension of those on the second engaging portion 124. Thus, a larger depressing force must be exerted to the faster 100 by the screwdriver in order to enable the mesh point B located at the bottom end of the first engaging portion 122 to engage with the mesh point A1 of the inner threads of the threaded hole 210. The increased depressing force on the fastener 100 causes the cutouts 1262 to be compressed. After the fastener 100 is entirely threaded in the threaded hole 210 and the depressing force exerted thereon by the screwdriver is released, the cutouts 1262 are expanded in order to return to their original configurations, whereby a resilient force of expansion is generated to the fastener 100 and by the resilient force the outer threads on the fastener 100 can have a very secure engagement with the inner threads in the threaded hole 210. Thus, the heat sink 300 can have an intimate contact with the electronic device 500 even if the electronic device 500 is subject to a vibration or a shock.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastener for fastening a heat sink to a printed circuit board, the fastener comprising:
    a head; and
    a shaft extending integrally from the head, the shaft comprising a first engaging portion having outer threads machined onto an exterior thereof, a second engaging portion having outer threads machined onto an exterior thereof, and a connecting portion interconnecting the first engaging portion and the second engaging portion, the connecting portion having two cutouts extending radially inwardly from an exterior thereof, the cutouts being substantially perpendicular to a central axis of the shaft;
    wherein the two cutouts are adjacent to the first engaging portion and the second engaging portion respectively;
    wherein the two cutouts are located at two opposite sides of the connecting portion respectively; and
    wherein the two cutouts each have a radial length approximately equal to a radius of the connecting portion.

2. The fastener as claimed in claim 1, wherein the outer threads on the first engaging portion have a same pitch as those on the second engaging portion.

3. The fastener as claimed in claim 2, wherein a sum of axial lengths of the connecting portion and the second engaging portion is not an integer multiple of the pitch of the outer threads.

4. The fastener as claimed in claim 1, wherein the head defines a cross-shaped groove at a top end thereof.

5. The fastener as claimed in claim 1, wherein the first engaging portion has a same diameter as the second engaging portion, but the diameter of the first engaging portion is larger than that of the connecting portion.

* * * * *